(12) United States Patent
Chai et al.

(10) Patent No.: US 7,923,176 B2
(45) Date of Patent: Apr. 12, 2011

(54) MASK AND METHOD OF MANUFACTURING THE SAME

(75) Inventors: Chong-Chul Chai, Seoul (KR);
Mee-Hye Jung, Suwon-si (KR);
Woo-Geun Lee, Yongin-si (KR);
Woo-Seok Jeon, Seongnam-si (KR);
Young-Wook Lee, Suwon-si (KR);
Jung-In Park, Suwon-si (KR);
Jun-Hyung Souk, Yongin-si (KR);
Won-Kie Chang, Seoul (KR); Shi-Yul Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 449 days.

(21) Appl. No.: 12/035,086

(22) Filed: Feb. 21, 2008

(65) Prior Publication Data

US 2008/0237037 A1   Oct. 2, 2008

(30) Foreign Application Priority Data

Mar. 28, 2007   (KR) .................. 10-2007-0030511

(51) Int. Cl.
*G03F 1/00*   (2006.01)
*G06C 5/00*   (2006.01)

(52) U.S. Cl. ........................................ 430/5; 430/311

(58) Field of Classification Search .............. 430/5, 311, 430/394
See application file for complete search history.

(56) References Cited

U.S. PATENT DOCUMENTS

| | | | |
|---|---|---|---|
| 2002/0182545 A1* | 12/2002 | Minami et al. ................ 430/311 |
| 2002/0186332 A1* | 12/2002 | Kwak et al. .................... 349/43 |
| 2003/0091940 A1* | 5/2003 | Nakao ............................ 430/322 |
| 2003/0203287 A1* | 10/2003 | Miyagawa ........................ 430/5 |
| 2005/0208427 A1* | 9/2005 | Hayano et al. ................ 430/311 |
| 2007/0037070 A1* | 2/2007 | Ohnuma et al. .................. 430/5 |

* cited by examiner

*Primary Examiner* — Stephen Rosasco
*Assistant Examiner* — Rashid Alam
(74) *Attorney, Agent, or Firm* — Innovation Counsel LLP

(57) ABSTRACT

A mask includes a transparent substrate, a light-blocking layer and a halftone layer. The light-blocking layer includes a source electrode pattern portion including a first electrode portion, a second electrode portion and a third electrode portion, and a drain electrode pattern portion disposed between the second electrode portion and the third electrode portion. The halftone layer includes a halftone portion corresponding to a spaced-apart portion between the source electrode pattern portion and the drain electrode pattern portion, and a dummy halftone portion more protrusive than ends of the second electrode portion and the third electrode portion. Thus, a photoresist pattern corresponding to a channel portion of a thin film transistor (TFT) may be formed with a uniform thickness, to thereby prevent an excessive etching of the channel portion.

25 Claims, 8 Drawing Sheets

MASK AND METHOD OF MANUFACTURING THE SAME

CROSS-REFERENCE TO RELATED APPLICATIONS

The present application claims priority under 35 U.S.C. §119 to Korean Patent Application No. 10-2007-30511, filed on Mar. 28, 2007 in the Korean Intellectual Property Office (KIPO), the contents of which are herein incorporated by reference in their entirety.

BACKGROUND OF THE INVENTION

1. Field of the Invention

The present invention relates to a mask and a method of manufacturing the mask. More particularly, the present invention relates to a mask for manufacturing a display substrate and a method of manufacturing the mask.

2. Description of the Related Art

Generally, in forming a thin-film transistor (TFT), a portion between a source electrode and a drain electrode is exposed to light by using a slit bar or a halftone layer, and then an etch-back process is performed to form a channel portion, in a method of manufacturing a display substrate using three masks or four masks.

When the channel portion is formed through an exposure process using a slit bar, a pattern caused by the diffraction of light passing through the slit is written on the photoresist, which pattern is not present in an exposure process using a halftone layer. Thus, a width of the channel portion formed in the exposure process using a slit bar is non-uniform.

On the other hand, when the channel portion is formed through an exposure process using a halftone layer, the channel portion is more uniform in comparison with the exposure process using a slit bar. However, even when using the halftone layer exposure process, the patterned channel portion is more recessed than an edge of the source electrode, to thereby incur a difference between the channel portion and the source electrode.

SUMMARY OF THE INVENTION

The present invention obviates the above problems and thus, the present invention provides a mask capable of reducing defects that are generated in forming a channel portion of a TFT.

The present invention also provides a method of manufacturing the above-mentioned mask.

In one aspect of the present invention, a mask includes a transparent substrate, a light-blocking layer and a halftone layer. The light-blocking layer is formed on the transparent substrate. The light-blocking layer includes a source electrode pattern portion including a first electrode portion extending in a first direction, a second electrode portion bent from a first end of the first electrode portion and extending in a second direction substantially perpendicular to the first direction and a third electrode portion bent from a second end of the first electrode portion and extending in the second direction, and a drain electrode pattern portion disposed between the second electrode portion and the third electrode portion and extending in the second direction. The halftone layer is formed on the transparent substrate. The halftone layer includes a halftone portion corresponding to a spaced-apart portion between the source electrode pattern portion and the drain electrode pattern portion, and a dummy halftone portion connected to the halftone portion and more protrusive than an end of the second electrode portion and an end of the third electrode portion in the second direction.

In another aspect of the present invention, a mask includes a transparent substrate and a light-blocking layer. The light-blocking layer is formed on the transparent substrate. The light-blocking layer includes a source electrode pattern portion including a first electrode portion extending in a first direction, a second electrode portion bent from a first end of the first electrode portion and extending in a second direction substantially perpendicular to the first direction and a third electrode portion bent from a second end of the first electrode portion and extending in the second direction, and a drain electrode pattern portion disposed between the second electrode portion and the third electrode portion and extending in the second direction, the drain electrode pattern portion being spaced apart from the source electrode pattern portion.

In still another aspect of the present invention, a method of manufacturing a mask is provided as follows. A light-blocking material layer is formed on a transparent substrate. The light-blocking material layer is patterned to form a light-blocking layer. The light-blocking layer includes a source electrode pattern portion including a first electrode portion extending in a first direction, a second electrode portion bent from a first end of the first electrode portion and extending in a second direction substantially perpendicular to the first direction and a third electrode portion bent from a second end of the first electrode portion and extending in the second direction, and a drain electrode pattern portion disposed between the second electrode portion and the third electrode portion and extending in the second direction. A halftone material layer is formed on the transparent substrate having the light-blocking layer. The halftone material layer is patterned to form a halftone layer. The halftone layer includes a halftone portion corresponding to a spaced-apart portion between the source electrode pattern portion and the drain electrode pattern portion, and a dummy halftone portion connected to the halftone portion and more protrusive than an end of the source electrode pattern portion corresponding to the second direction.

In still another aspect of the present invention, a method of manufacturing a mask is provided as follows. A halftone layer and a light-blocking layer are formed on a transparent substrate. The halftone layer and the light-blocking layer are patterned to form an electrode pattern portion. First, second, third, fourth and fifth opening patterns are formed through the light-blocking layer of the electrode pattern portion to form a source electrode pattern portion and a drain electrode pattern portion spaced apart from the source electrode pattern portion. The first opening pattern extends in a first direction, the second opening pattern is bent from the first opening pattern and extends in a second direction substantially perpendicular to the first direction, the third opening pattern is bent from the second opening pattern and extends in the first direction, the fourth opening pattern is bent from the third opening pattern and extends in a third direction opposite to the second direction, and the fifth opening pattern is bent from the fourth opening pattern and extends in the first direction.

According to the above, a TFT patterned through a photolithography process using the mask may have a channel portion of uniform width.

BRIEF DESCRIPTION OF THE DRAWINGS

The above and other features and advantage points of the present invention will become more apparent by describing in detailed exemplary embodiments thereof with reference to the accompanying drawings, in which.

DESCRIPTION OF THE EMBODIMENTS

Figure 1:
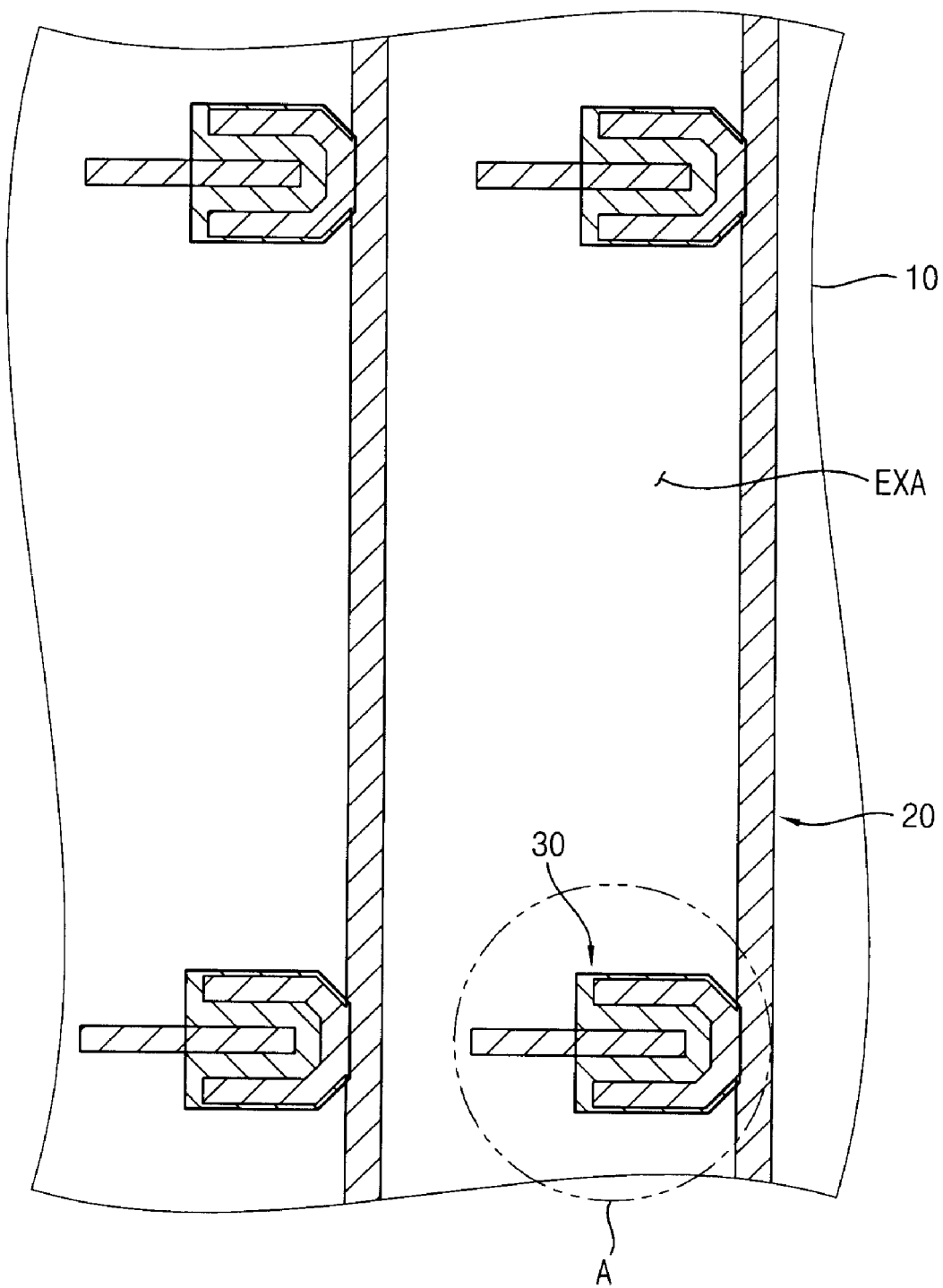
FIG. 1 is a partial plan view illustrating a mask according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third and the like, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention is described in detail with reference to the accompanying drawings.

FIG. 1 is a partial plan view illustrating a mask according to a first exemplary embodiment of the present invention.

Figure 2:
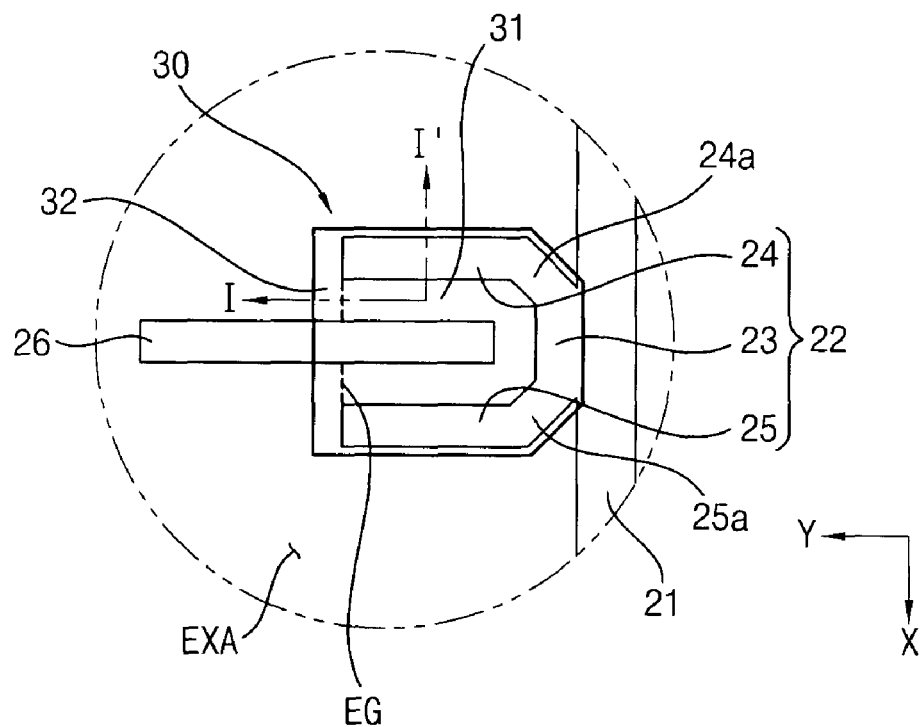
FIG. 2 is an enlarged plan view of a portion 'A' in FIG. 1.

FIG. 2 is an enlarged plan view of a portion 'A' in FIG. 1.

Figure 3:
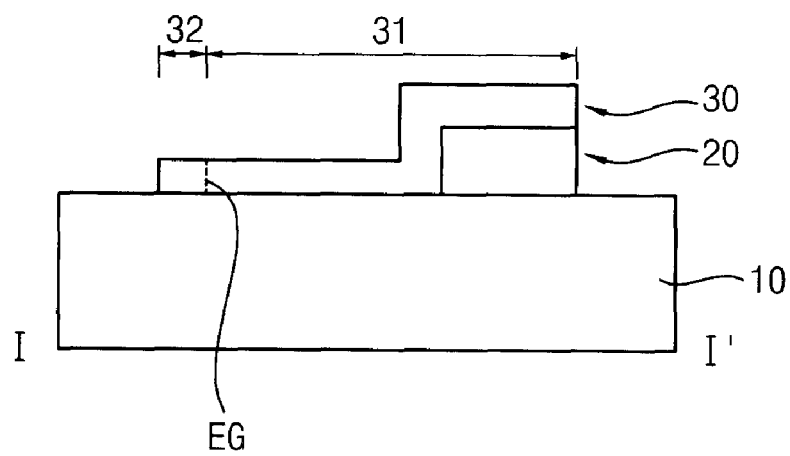
FIG. 3 is a cross-sectional view taken along a line I-I' in FIG. 2.

FIG. 3 is a cross-sectional view taken along a line I-I' in FIG. 2.

Referring to FIGS. 1 to 3, a mask according to a first exemplary embodiment of the present invention includes a transparent substrate 10, a light-blocking layer 20 and a halftone layer 30.

The transparent substrate 10 may include a material transmitting light, for example, such as quartz.

The light-blocking layer 20 may include a material blocking light. For example, the light-blocking layer 20 may have a structure in which a chromium (Cr) layer and a chromium oxide (CrOx) layer are formed. When the light-blocking layer 20 has the above-described structure, the Cr layer may have a thickness of about 1000 Å.

The halftone layer 30 is a material that partially transmits light. For example, the halftone layer 30 may be selected such that it absorbs a half and transmits another half of the light transmitted to the transparent substrate 10.

The halftone layer 30 is formed in part on the light-blocking layer 20. For example, the halftone layer 30 may have a structure in which a Cr layer and a CrOx layer are formed. When the halftone layer 30 has the above-described structure, the Cr layer may have a thickness of about 300 Å to about 500 Å. Alternatively, the halftone layer 30 may include molybdenum silicide (MoSi).

An exposure portion EXA, through which light is transmitted, is formed in an area in which the light-blocking layer 20 and the halftone layer 30 are not formed on the transparent substrate 10.

The mask may be used to pattern metal lines of a display substrate employed in a display device such as a liquid crystal display panel. For example, the mask may be used to form a data metal pattern such as a data line and source and drain electrodes of a TFT. When a photolithography process is performed using the mask, the data metal pattern of the display substrate has substantially the same shape as the light-blocking layer 20.

For example, the light-blocking layer 20 includes a data line pattern portion 21 to pattern a data line, a source electrode pattern portion 22 to pattern a source electrode, and a drain electrode pattern portion 26 to pattern a drain electrode.

The source electrode pattern portion 22 is connected to the data line pattern portion 21, and includes, for example, a first electrode portion 23, a second electrode portion 24 and a third electrode portion 25.

The first electrode portion 23 extends in a first direction X. The second electrode portion 24 includes a bent portion 24a which extends from first electrode portion 23, and second electrode portion 24 extends in a second direction Y substantially perpendicular to the first direction X. The third electrode portion 25 includes bent portion 25a which extends from the first electrode portion 23, and third electrode portion 25 extends in the second direction Y. Alternatively, bent portions 24a and 25a may be curved rather than straight portions as illustrated in FIG. 2.

The second electrode portion 24 and the third electrode portion 25 may have substantially the same length or have a different length. In FIG. 2, in an exemplary embodiment, the second electrode portion 24 and the third electrode portion 25 have substantially the same length.

The drain electrode pattern portion 26 is spaced apart from the source electrode pattern portion 22 by a predetermined space, and disposed between the second electrode portion 24 and the third electrode portion 25. The drain electrode pattern portion 26 extends in the second direction Y to be more protrusive than an end of the second electrode portion 24 extending the second direction Y and an end of the third electrode portion 25 extending the second direction Y.

A spaced-apart portion between the source electrode pattern portion 22 and the drain electrode pattern portion 26 determines a width and a shape of a channel portion of a TFT.

The halftone layer 30 includes a halftone portion 31 and a dummy halftone portion 32. The halftone portion 31 corresponds to the spaced-apart portion between the source electrode pattern portion 22 and the drain electrode pattern portion 26 (hereinafter referred to as "spaced-apart portion"). The dummy halftone portion 32 extends from the halftone portion 31 and is more protrusive in the second direction Y than an end of the source electrode pattern portion 22 extending in the second direction Y. For example, the halftone portion 31 covers the source electrode pattern portion 22 and the drain electrode pattern portion 26, in addition to the spaced-apart portion.

When a photolithography process of a positive type photoresist film is performed using the mask according to the first exemplary embodiment, a portion of the photoresist film corresponding to the light-blocking layer 20 remains having substantially the same thickness as a thickness before development, a portion of the photoresist film corresponding to an area in which the halftone layer 30 is exposed remains having about a half thickness of a thickness before development, and a portion of the photoresist film corresponding to the exposure portion EXA is completely eliminated.

An edge of the light-blocking layer 20 and an edge of the halftone layer 30 are adjacent to the exposure portion EXA. Thus, when a photoresist film is exposed to light using the mask, a relatively large amount of light is irradiated on a portion of the photoresist film corresponding to the edge of the light-blocking layer 20 and the edge of the halftone layer 30. An end EG of the spaced-apart portion corresponding to the second direction Y, at which the halftone layer 30 is formed but the light-blocking layer 20 is not formed, may be excessively affected by the exposure portion EXA.

Accordingly, when a photolithography process of a photoresist film is performed using a mask not having a dummy halftone portion 32, a portion of the photoresist film corresponding to the end EG of the spaced-apart portion is substantially dissolved by a developing solution. Thus, a portion of the photoresist film corresponding to the end EG of the spaced-apart portion has non-uniform thickness after a development process.

Therefore, when a channel portion of a TFT is formed using the remaining photoresist film serving as an etching mask, an area corresponding to the end EG of the spaced-apart portion may be excessively etched. Thus, the channel portion may be more recessed than the end of the source electrode extending in the second direction Y, thereby incurring non-uniform driving characteristics of the TFT.

In contrast, when the dummy halftone portion 32 is formed, the excessive exposure due to the end EG of the halftone portion 31 corresponding to the second direction Y being adjacent to the exposure portion EXA may be prevented. Thus, the channel portion of the TFT may be prevented from being excessively etched. Hence, the channel portion of the TFT may have uniform width and a sufficient length. Alternatively, if the light-blocking layer 20 and the exposure portion EXA illustrated in FIG. 1 are exchanged with each other, then a photolithography process may be performed using a negative type photoresist film.

Figure 4:
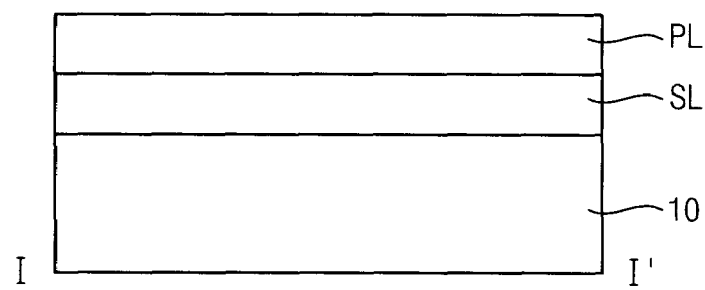
FIGS. 4 to 6 are cross-sectional views illustrating a method of manufacturing the mask in FIG. 1.
Figure 5:
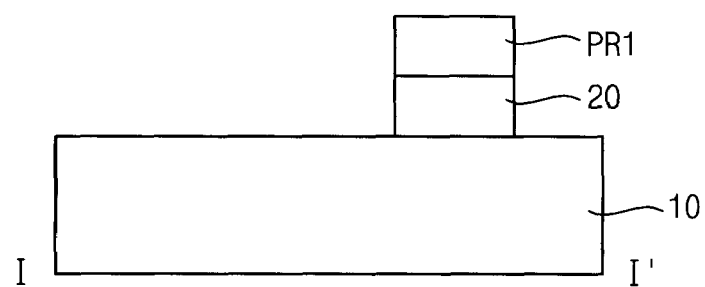
Figure 6:
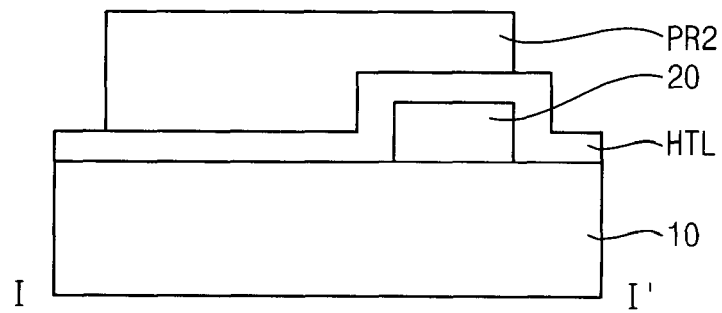

FIGS. 4 to 6 are cross-sectional views illustrating a method of manufacturing the mask in FIG. 1.

Hereinafter, a method of manufacturing the mask according the first exemplary embodiment of the present invention is described in detail with reference to the accompanying drawings of FIGS. 4 to 6.

Referring to FIGS. 2 and 4, a light-blocking material layer SL and a first photoresist film PL are successively formed on a transparent substrate 10. For example, the light-blocking material layer SL may have a structure in which a Cr layer and a CrOx layer are formed. The light-blocking material layer SL may be formed through a sputtering method. When the light-blocking material layer SL has the above-described structure, the Cr layer may have a thickness of about 1000 Å.

Also, the first photoresist film PL may correspond to, for example, a positive type photoresist, in which an area exposed to light is dissolved by a developing solution.

Then, a desired pattern is written on the first photoresist film PL by using a laser, and the first photoresist film PL having the desired pattern is developed using a developing solution.

Thus, referring to FIG. 5, a first photoresist pattern PR1 is formed on the transparent substrate 10. Thereafter, the light-blocking material layer SL is patterned using the first photoresist pattern PR1 serving as an etching mask to form the light-blocking layer 20 having substantially the same shape as the first photoresist pattern PR1.

Referring to FIGS. 2 and 5, the light-blocking layer 20 includes, for example, a data line pattern portion 21 to pattern a data line of a display substrate, a source electrode pattern portion 22 connected to the data line pattern portion 21 to pattern a source electrode, and a drain electrode pattern portion 26 spaced apart from the source electrode pattern portion 22 to pattern a drain electrode. In an exemplary embodiment, a wet etch process may be performed to form the light-blocking layer 20.

A spaced-apart portion between the source electrode pattern portion 22 and the drain electrode pattern portion 26 (hereinafter referred to as "spaced apart portion") corresponds to an area for forming a channel portion of a TFT.

After an etch process of forming the light-blocking layer 20 is terminated, a strip process of removing the first photoresist pattern PR1 is performed.

Referring to FIGS. 2 and 6, a halftone material layer HTL is formed on the transparent substrate 10 and on the light-blocking layer 20. For example, the halftone material layer HTL may have a structure in which a Cr layer and a CrOx layer are formed. Alternatively, the halftone material layer HTL may include MoSi, and may be formed by a sputtering method.

When the halftone material layer HTL has a structure in which a Cr layer and a CrOx layer are formed, the Cr layer may have a thickness of about 300 Å to about 500 Å.

Thereafter, a second photoresist film (not shown) is formed on the halftone material layer HTL. The second photoresist film may correspond to, for example, positive type photoresist film. Then, a desired pattern is written on the second photoresist film by using a laser, and the second photoresist film having the desired pattern is developed using a developing solution, to thereby form a second photoresist pattern PR2.

Thereafter, the halftone material layer HTL is etched using the second photoresist pattern PR2 serving as an etching mask to form a halftone layer 30 including a halftone portion 31 and a dummy halftone portion 32.

When the halftone material layer 30 has a structure in which a Cr layer and a CrOx layer are formed, the halftone material layer HTL may be formed through a wet etch process. Alternatively, when the halftone material layer HTL includes MoSi, the halftone material layer HTL may be formed through a dry etch process.

Particularly, the halftone portion 31 of the halftone layer 30 may cover the spaced-apart portion. For example, the halftone portion 31 may be patterned to cover the source electrode pattern portion 22, the drain electrode pattern portion 26 and the spaced-apart portion. The dummy halftone portion 32 of halftone layer 30 extends from halftone portion 31 an additional amount in the second direction Y beyond the desired end of the source electrode pattern portion 22 corresponding to the second direction Y. As pointed out below in greater detail, dummy halftone portion 32 prevents an overetch of a photoresist film used in manufacturing the TFT.

An exposure portion EXA, through which light is transmitted, is formed in an area in which the light-blocking layer 20 and the halftone layer 30 are not formed on the transparent substrate 10.

When the dummy halftone portion 32 is not formed on the transparent substrate 10, the end EG of the halftone portion 31 corresponding to the second direction Y is directly connected to the exposure portion EXA, through which light is entirely transmitted, so that the end EG of the halftone portion 31 is exposed to a relatively large amount of light in comparison with other areas of the halftone portion 31. Thus, when a photolithography process of a photoresist film is performed using a mask not having a dummy halftone portion 32, a portion of the photoresist film corresponding to the end of the spaced-apart portion is excessively dissolved by a developing solution. Thus, a portion of the photoresist film corresponding to the spaced-apart portion has non-uniform thickness after a development process, thereby excessively etching an area corresponding to the end EG of the spaced-apart portion through an etch process of forming a channel portion of a TFT.

In contrast, when the dummy halftone portion 32 is formed, the excess exposure to the end EG of the halftone portion 31 corresponding to the second direction Y being adjacent to the exposure portion EXA may be prevented. Thus, the channel portion of the TFT may have uniform width, and have a sufficient length.

After an etch process of forming the halftone layer 30 is terminated, a strip process of removing the second photoresist pattern PR2 is performed. Thus, the mask according to the first exemplary embodiment of the present invention is manufactured.

Figure 7:
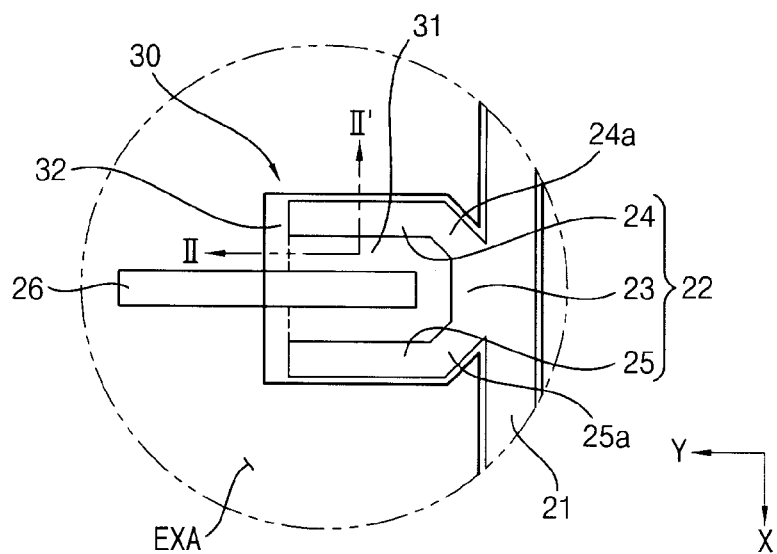
FIG. 7 is a plan view illustrating a mask according to a second exemplary embodiment of the present invention.

FIG. 7 is a plan view illustrating a mask according to a second exemplary embodiment of the present invention.

Figure 8:
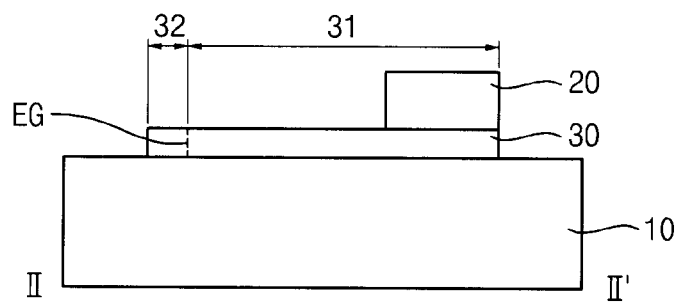
FIG. 8 is a cross-sectional view taken along a line II-II' in FIG. 7.

FIG. 8 is a cross-sectional view taken along a line II-II' in FIG. 7.

The mask according to the second exemplary embodiment of the present invention is very similar to the mask according to the first exemplary embodiment of the present invention. Thus, only the differences will be described in detail. The same reference numerals will be used to refer to substantially the same elements.

Referring to FIGS. 7 and 8, a mask according to the second exemplary embodiment of the present invention includes a transparent substrate 10, a halftone layer 30 and a light-blocking layer 20.

The halftone layer 30 is formed between the transparent substrate 10 and the light-blocking layer 20. The halftone layer 30 includes a halftone portion 31 and a dummy halftone portion 32.

The halftone portion 31 corresponds to a data line pattern portion 21 of the light-blocking layer 20, a source electrode pattern portion 22, a drain electrode pattern portion 26 and a spaced-apart portion between the source electrode pattern portion 22 and the drain electrode pattern portion 26 (hereinafter referred to as "spaced apart portion").

The dummy halftone portion 32 is connected to the halftone portion 31, and is a little more protrusive in the second direction Y than an end of the source electrode pattern portion 22 corresponding to the second direction Y.

An effect by the dummy halftone portion 32 is substantially the same as the effect by the mask according to the first exemplary embodiment of the present invention.

FIGS. 9 to 11B are cross-sectional views illustrating a method of manufacturing the mask in FIG. 7.

Figure 9:
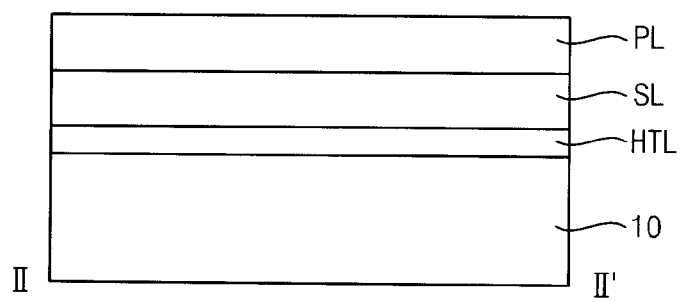
FIGS. 9 to 11B are cross-sectional views illustrating a method of manufacturing the mask in FIG. 7.

Referring to FIGS. 7 and 9, a halftone material layer HTL, a light-blocking material layer SL and a first photoresist film PL are successively formed on the transparent substrate 10. The halftone material layer HTL, the light-blocking material layer SL and the first photoresist film PL are formed by substantially the same processes as the method of manufacturing the mask according to the first exemplary embodiment of the present invention. Thus, any further description is unnecessary.

Then, a desired pattern is written on the first photoresist film PL by using a laser, and the first photoresist film PL having the desired pattern is developed using a developing solution.

Figure 10A:
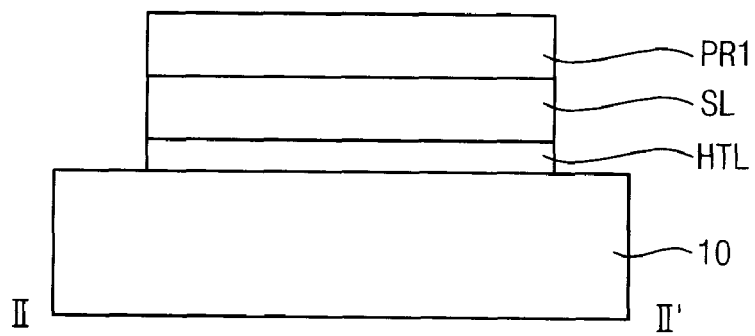
Figure 10B:
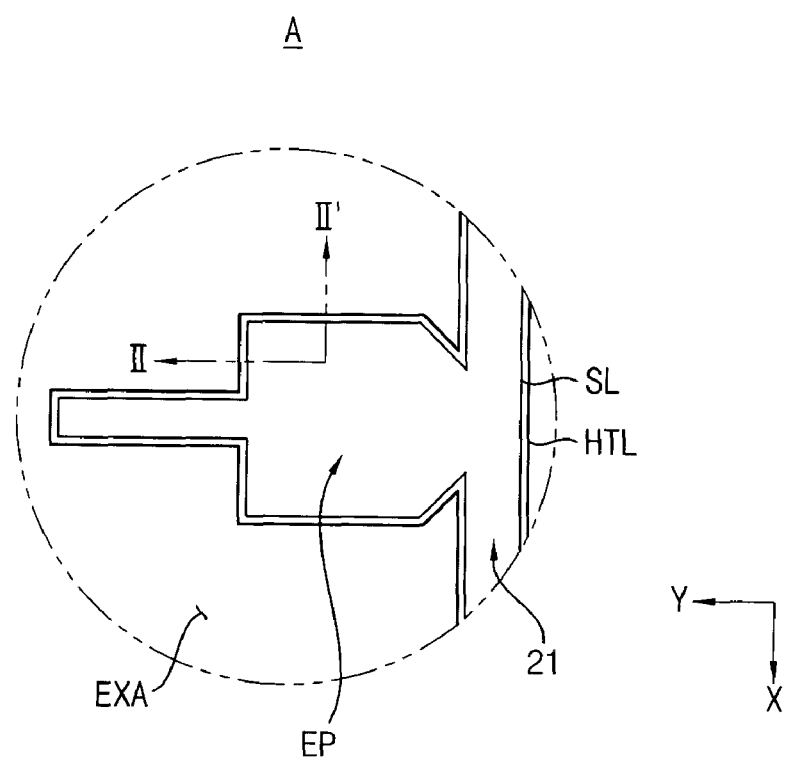

Thus, referring to FIGS. 10A and 10B, the first photoresist pattern PR1 is formed. Thereafter, the light-blocking material layer SL and the halftone material layer HTL are successively etched using the first photoresist pattern PR1 serving as an etching mask to form a data line pattern portion 21 and an electrode pattern portion EP connected to the data line pattern portion 21, the data line pattern portion 21 and the electrode pattern portion EP having a structure in which the light-blocking material layer SL and the halftone material layer HTL are formed.

After an etch process of forming the data line pattern portion 21 and the electrode pattern portion EP is terminated, a strip process of removing the first photoresist pattern PR1 is performed.

Figure 11A:
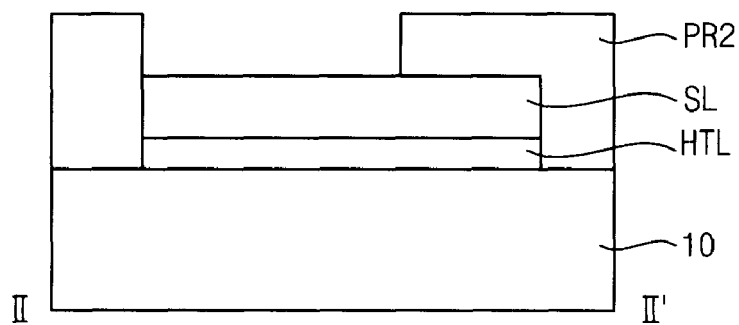
Figure 11B:
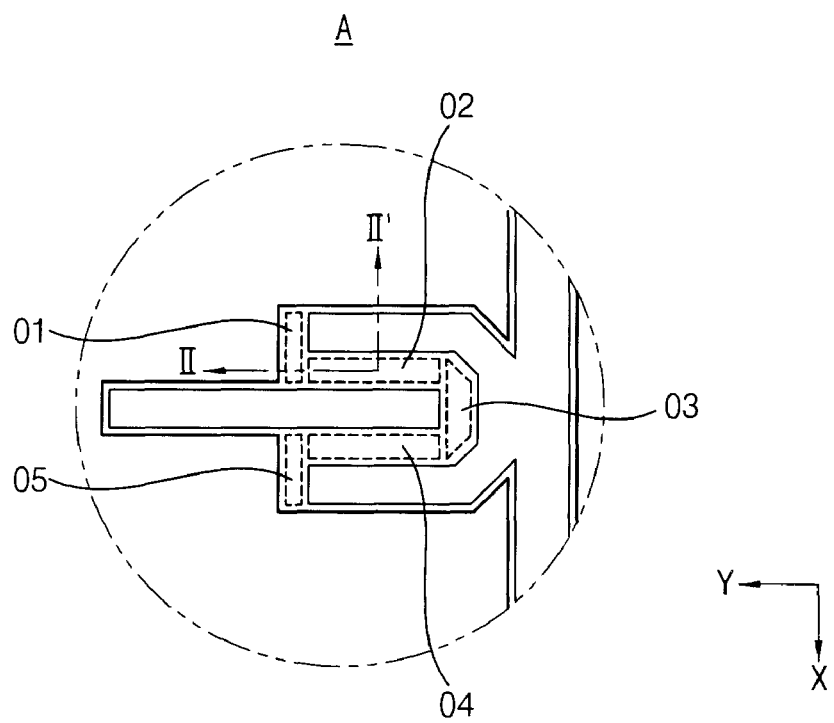

Referring to FIGS. 7, 11A and 11B, a second photoresist film (not shown) is formed on the transparent substrate 10 having the data line pattern portion 21 and electrode pattern portion EP. Then, a desired pattern is written on the second photoresist film by using a laser, and the second photoresist film having the desired pattern is developed using a developing solution, to thereby form a second photoresist pattern PR2.

Thereafter, an etch process using the second photoresist pattern PR2 serving as an etching mask to form first, second, third, fourth and fifth opening patterns O1, O2, O3, O4 and O5 through the light-blocking material layer SL of the electrode pattern portion EP, all as illustrated in FIG. 11B. For example, the first opening pattern O1 extends in the first direction X on the electrode pattern portion EP. The second opening pattern O2 is bent from the first opening pattern O1 and extends in the third direction opposite to the second direction Y. The third opening pattern O3 is bent from the second opening pattern O2 and extends in the first direction X. The fourth opening pattern O4 is bent from the third opening pattern O3 and extends in the second direction Y. The fifth opening pattern O5 is bent from the fourth opening pattern O4 and extends in the first direction X.

Thus, referring to FIGS. 11A, 11B, 7 and 8, the source electrode pattern portion 22 that is connected to the data line pattern portion 21 and the drain electrode pattern portion 26 that is spaced apart from the source electrode pattern portion 22 by the first to fifth opening patterns O1, O2, O3, O4 and O5 are formed on the transparent substrate 10.

Accordingly, the light-blocking material layer SL is patterned to define light-blocking layer 20 such that the data line pattern portion 21, the source electrode pattern portion 22 and the drain electrode pattern portion 26 will be produced when using the mask, and the halftone material layer HTL remaining after removing portions of the light-blocking layer 20 defines the halftone layer 30 including the halftone portion 31 and the dummy halftone portion 32.

More particularly, portions of the halftone material layer HTL corresponding to an area overlapping the light-blocking layer 20 and an area exposed at the second to fourth opening patterns O2, O3 and O4 define the halftone portion 31, and a portion of the halftone material layer HTL corresponding to an area exposed at the first and fifth opening patterns O1 and O5 defines the dummy halftone portion 32. After an etch process of forming the light-blocking layer 20 and the halftone layer 30 is terminated, a strip process of removing the second photoresist pattern PR2 is performed. Therefore, the mask illustrated in FIGS. 7 and 8 according to the second exemplary embodiment of the present invention is manufactured.

The masks according to the first exemplary embodiment and the second exemplary embodiment may be applied to a light exposure apparatus of a stamp type or a scanner type.

Figure 12:
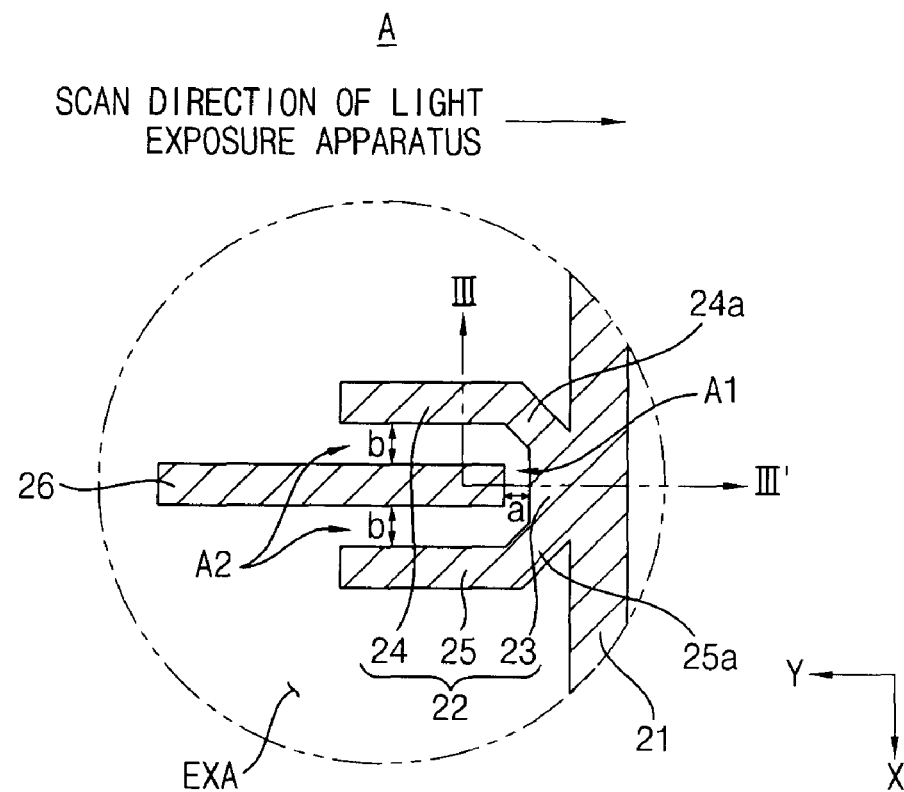
FIG. 12 is a plan view illustrating a mask according to a third exemplary embodiment of the present invention.

FIG. 12 is a plan view illustrating a mask according to a third exemplary embodiment of the present invention.

Figure 13:
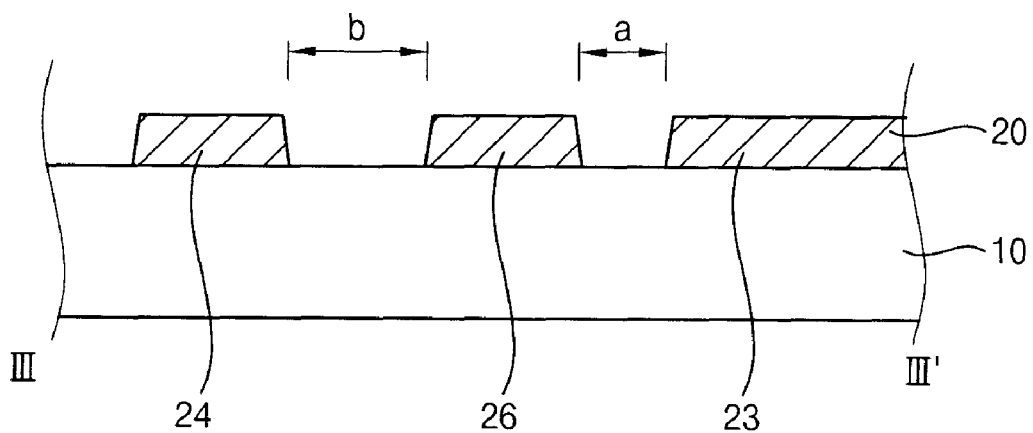
FIG. 13 is a cross-sectional view taken along a line III-III' in FIG. 12.

FIG. 13 is a cross-sectional view taken along a line III-III' in FIG. 12.

Referring to FIGS. 12 and 13, a mask according to a third exemplary embodiment of the present invention includes a transparent substrate 10 and a light-blocking layer 20.

The transparent substrate 10 may include a material transmitting light for example, such as quartz.

The light-blocking layer 20 may include a material blocking light. For example, the light-blocking layer 20 may have a structure in which a chromium (Cr) layer and a chromium oxide (CrOx) layer are formed. Alternatively, the light-blocking layer 20 may include molybdenum silicide (MoSi). When the light-blocking layer 20 has a structure in which a chromium (Cr) layer and a chromium oxide (CrOx) layer are formed, the chromium (Cr) layer may have a thickness of about 1000 Å.

An exposure portion EXA, through which light is transmitted, is formed in an area in which the light-blocking layer 20 is not formed on the transparent substrate 10.

The mask may be used to pattern metal lines of a display substrate employed in a display device such as a liquid crystal display panel. For example, the mask may be used to form a data metal pattern such as a data line and source and drain electrodes of a TFT.

For example, the light-blocking layer 20 includes a data line pattern portion 21, a source electrode pattern portion 22 and a drain electrode pattern portion 26.

The source electrode pattern portion 22 is connected to the data line pattern portion 21, and includes, for example, a first electrode portion 23, a second electrode portion 24 and a third electrode portion 25.

The first electrode portion 23 extends in a first direction X that is substantially perpendicular to a scan direction of a light exposure apparatus. Thus, the first direction X is determined by the scan direction of the light exposure apparatus.

The second electrode portion 24 includes bent portion 24a which extends between the first electrode portion 23 and second electrode portion 24 which extends in a second direction Y substantially perpendicular to the first direction X. The second direction Y is substantially parallel with the scan direction of the light exposure apparatus.

Third electrode portion 25 includes bent portion 25a which extends between the first electrode portion 23 third electrode portions 25 which extends in the second direction Y. Bent portions 24a and 25a may be curved instead of being straight as shown in the figures.

The second electrode portion 24 and the third electrode portion 25 may have substantially the same length or a different length. In FIG. 12, in an exemplary embodiment, the second electrode portion 24 and the third electrode portion 25 have substantially the same length.

The drain electrode pattern portion 26 is disposed between the second electrode portion 24 and the third electrode portion 25 and extends in the second direction Y. A space between the end of drain electrode pattern portion 26 and the first electrode portion 23 is defined as a first width 'a', and a space between the drain electrode pattern portion 26 and the second electrode portion 24 or between the drain electrode pattern portion 26 and the third electrode portion 25 is defined as a second width 'b'. Since the end of drain electrode pattern portion 26 and the first electrode portion 23 are spaced apart from each other by the first width 'a', a first opening area A1 is formed between the first electrode portion 23 and the drain electrode pattern portion 26 to have the first width 'a'. Also, since the drain electrode pattern portion 26 is spaced apart from the second electrode portion 24 and the third electrode portion 25 by the second width 'b', a second opening area A2 is formed between the drain electrode pattern portion 26 and the second electrode portion 24 and between the drain electrode pattern portion 26 and the third electrode portion 25 to have the second width 'b'.

The first width 'a' and the second width 'b' may range from about 1.5 μm to about 3.5 μm. The first and second opening areas A1 and A2 define a channel portion of a TFT, and the first width 'a' and the second width 'b' determine a width of the channel portion of the TFT.

As described above, when the first width 'a' of the first opening area A1 and the second width 'b' of the second opening area A2 range from about 1.5 μm to about 3.5 μm, then the amount of transmitted light is greatly different from the exposure portion EXA having a relatively large area. Thus, the first and second opening areas A1 and A2 define a light diffraction portion, and not a light exposure portion EXA.

A conventional slit mask has a slit bar pattern between the source electrode pattern portion 22 and the drain electrode pattern portion 26 of the light-blocking layer 20. Thus, the first and second widths 'a' and 'b' of the conventional silt mask typically are about 5.5 μm, which is wider than those of the mask according to the present invention.

In contrast, in the present invention, the slit bar pattern is omitted, and the mask according to the present invention has a no-slit structure. Thus, the light-blocking layer 20 is formed, and then the first width 'a' and the second width 'b' are formed to range in width from about 1.5 μm to about 3.5 μm, thereby reducing the width of the channel portion of the TFT.

When a light exposure apparatus of a scanner type is used, the diffracted amount of light varies according to a direction that is substantially perpendicular to or substantially parallel with the scan direction of the light in the first opening area A1 and the second opening area A2 corresponding to the channel portion.

The diffracted amount of light is greater in the first opening area A1 having the first width 'a', which is open in a direction substantially parallel with the scan direction of the light exposure apparatus, than in the second opening area A2 which is open in a direction substantially perpendicular with the scan direction of the light exposure apparatus.

Since the mask of a no-slit structure has the first and second widths 'a' and 'b' that are relatively narrow in comparison with a resolution of the light exposure apparatus, an effect of the diffraction of light is great. In addition, since the diffraction amount of light is related to a wavelength of light of the light exposure apparatus, the wavelength of light of the light exposure apparatus may range from about 380 nm to about 420 nm considering the resolution of the light exposure apparatus.

Accordingly, when the first and second widths 'a' and 'b' are substantially the same, a portion of the photoresist film corresponding to the first opening area A1 is exposed more excessively than a portion of the photoresist film corresponding to the second opening area A2. Since an excessive exposure of the photoresist film generate open defects on a thin film, the first and second widths 'a' and 'b' of the present invention are different from each other.

Thus, the first width 'a' has a narrower width than the second width 'b', to thereby reduce the effect of the diffraction of light. Hence, when a photolithography process is performed using the mask according to the third exemplary embodiment, the portion of the photoresist film corresponding to the first opening area A1 and the portion of the photoresist film corresponding to the second opening area A2 may have substantially the same width and thickness.

In another exemplary embodiment, a difference between the first width 'a' and the second width 'b' may range from about 0.05 μm to about 0.45 μm. In addition, the second width 'b' may be greater than the first width 'a' by about 0.2 μm. When the difference between the first width 'a' and the second width 'b' is less than about 0.05 μm, an effect of controlling an exposure amount of light due to the difference between the first width 'a' and the second width 'b' is low. When the difference between the first width 'a' and the second width 'b' is greater than about 0.45 μm, an exposure amount of light through the second opening area A2 is greater than an exposure amount of light through the first opening area A1. Therefore, the difference between the first width 'a' and the second width 'b' may preferably be in a range of about 0.05 μm to about 0.45 μm.

Since bent portion 24a between the first electrode portion 23 and the second electrode portion 24 and a bent portion 25a between the first electrode portion 23 and the third electrode portion 25 may be curved, a distance between the source electrode pattern portion 22 and the drain electrode pattern portion 26 gradually varies from the first width 'a' to the second width 'b' in the bent portions.

When a photolithographic process of a positive type photoresist film is performed using the mask according to the third exemplary embodiment of the present invention, a portion of the photoresist film corresponding to the light-blocking layer remains having substantially the same thickness as a thickness before development, a portion of the photoresist film corresponding to the first and second opening areas A1 and A2 remains having about a half thickness of a thickness before development, and a portion of the photoresist film corresponding to the exposure portion EXA is completely eliminated.

Since the exposure amount of light through the first opening area A1 is substantially the same as the exposure amount of light through the second opening area A2, the portion of the photoresist film corresponding to the first opening area A1 and the portion of the photoresist film corresponding to the second opening area A2 have substantially the same thickness and width after the development process.

In a photolithographic process using a conventional mask, in which the first width 'a' and the second width 'b' are substantially the same, a thickness variation between the portion of the photoresist film corresponding to the first opening area A1 and the portion of the photoresist film corresponding to the second opening area A2 is typically more than about 4000 Å. In contrast, the mask according to the third exemplary embodiment of the present invention may reduce the thickness variation to be less than about 1000 Å.

Since the first opening area A1 and the second opening area A2 determines the width of the channel portion of the TFT, the width of the channel portion may be uniform and any open defect due to local excessive etching may be prevented by using the mask according to the third exemplary embodiment of the present invention.

In FIGS. 12 and 13, the first opening area A1 extends in a direction substantially perpendicular to the scan direction of the light exposure apparatus, and the second opening area A2 extends in a direction substantially parallel with the scan direction of the light exposure apparatus. However, the extension directions of the first and second opening areas A1 and A2 are not limited thereto.

Thus, when the first opening area A1 extends in a direction substantially parallel with the scan direction of the light exposure apparatus, and the second opening area A2 extends in a direction substantially perpendicular to the scan direction of the light exposure apparatus, the second opening area A2 may have the first width 'a', and the first opening area A1 may have the second width 'b'.

Alternatively, if the light-blocking layer 20 and the exposure portion EXA illustrated in FIG. 12 are exchanged with each other, a photolithography process may be performed using a negative type photoresist film.

The mask according to the third exemplary embodiment of the present invention may further include a halftone layer 30 of the first and second exemplary embodiments of the present invention. When the mask according to the third exemplary embodiment of the present invention includes the halftone layer 30, any open defect due to local excessive etching of the channel portion may be prevented, and the channel portion may be prevented from being more recessed than an end of the source electrode.

Figure 14:
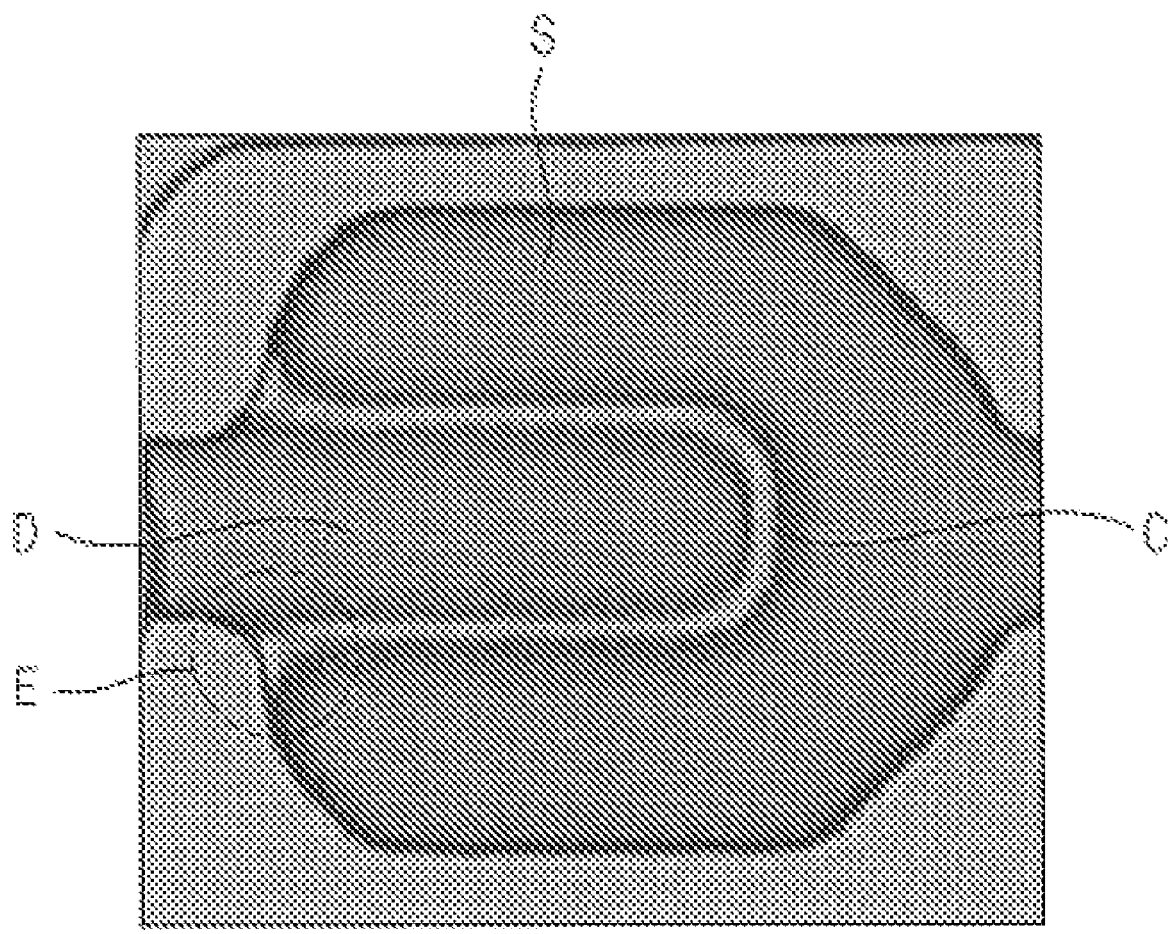
FIG. 14 is a picture showing a TFT manufactured using a mask according to an exemplary embodiment of the present invention.

FIG. 14 is a photograph showing a TFT manufactured using a mask according to an exemplary embodiment of the present invention.

A TFT includes a source electrode S patterned by the source electrode pattern portion, a drain electrode D patterned by drain electrode pattern portion and a channel portion C corresponding to a spaced-apart portion between the source electrode S and the drain electrode D.

Referring to FIG. 14, the end E of the channel portion C is not more recessed than an end of the source electrode S. A dummy halftone portion is formed in the mask to prevent excessive etching of an edge of the channel portion C. Thus, the channel portion C may have sufficient length and width. Also, a distance between the source electrode pattern portion and the drain electrode pattern portion of the mask varies according to the scan direction of the light exposure apparatus. Thus, the width of the channel portion C is uniform, and open defect of the channel portion C is not generated.

According to the present invention, a dummy halftone portion is formed to prevent an excessive exposure due to an end of halftone portion being adjacent to an exposure portion. Thus, a portion of a photoresist pattern corresponding to a channel portion may have uniform thickness, thereby preventing an excessive etching of the channel portion.

In addition, a width of a spaced-apart portion between a source electrode pattern portion and a drain electrode pattern portion varies according to a scan direction of a light exposure apparatus, to reduce exposure amount variation due to the diffraction amount of light according to the scan direction of the light exposure apparatus. Thus, the portion of the photoresist pattern corresponding to the channel portion may have uniform width and thickness, thereby reducing any open defects generated through an etch process of forming the channel portion.

Although exemplary embodiments of the present invention have been described, it is understood that the present invention should not be limited to these exemplary embodiments, but various changes and modifications can be made by one ordinary skilled in the art within the spirit and scope of the present invention as hereinafter claimed.

What is claimed is:

1. A mask comprising:
a transparent substrate;
a light-blocking layer formed on the transparent substrate, the light-blocking layer comprising:
a source electrode pattern portion comprising a first electrode portion extending in a first direction, a second electrode portion bent from a first end of the first electrode portion and extending in a second direction substantially perpendicular to the first direction and a third electrode portion bent from a second end of the first electrode portion and extending in the second direction; and
a drain electrode pattern portion disposed between the second electrode portion and the third electrode portion and extending in the second direction, the drain electrode pattern portion and the source electrode pattern portion disposed in non-overlapping positions so as to form a spaced-apart portion between the drain pattern portion and the source electrode pattern portion; and
a halftone layer formed on the transparent substrate, the halftone layer comprising:
a halftone portion corresponding to the spaced-apart portion between the source electrode pattern portion and the drain electrode pattern portion; and
a dummy halftone portion connected to the halftone portion and more protrusive than an end of the second electrode portion and an end of the third electrode portion in the second direction.

2. The mask according to claim 1 wherein at least one of the first and second intermediate portions is curved.

3. The mask according to claim 1, wherein at least one of the first and second intermediate portions extend along an axis which is at an angle with respect to the first direction.

4. The mask of claim 1, wherein the second electrode portion and the third electrode portion are of a common length.

5. The mask of claim 1, wherein the light blocking layer is formed on a surface of the transparent substrate and further wherein the halftone layer is formed at least in part on a surface of the light-blocking layer.

6. The mask of claim 1, wherein the halftone layer is formed between a surface of the transparent substrate and the light-blocking layer.

7. The mask of claim 1, wherein the mask is oriented such that the first direction is substantially perpendicular to a scan direction of a light exposure apparatus.

8. The mask of claim 1, wherein a first width between an edge of the drain electrode pattern portion and the first electrode portion is less than a second width between an edge of the drain electrode pattern portion and an edge of the second electrode portion, or between an edge of the drain electrode pattern portion and an edge of the third electrode portion.

9. The mask of claim 8, wherein each of the first width and the second width ranges from about 1.5 µm to about 3.5 µm.

10. The mask of claim 9, wherein a difference between the first width and the second width ranges from about 0.05 µm to about 0.45 µm.

11. The mask of claim 1, wherein the light-blocking layer further comprises a data line pattern portion connected to the source electrode pattern portion.

12. A mask comprising:
a transparent substrate; and
a light-blocking layer formed on the transparent substrate, the light-blocking layer comprising:
a source electrode pattern portion comprising a first electrode portion extending in a first direction, a second electrode portion bent from a first end of the first electrode portion and extending in a second direction substantially perpendicular to the first direction and a third electrode portion bent from a second end of the first electrode portion and extending in the second direction; and a drain electrode pattern portion disposed between the second electrode portion and the third electrode portion and extending in the second direction, the drain electrode pattern portion and the source electrode pattern portion disposed in non-overlapping positions so as to form a spaced-apart portion between the drain pattern portion and the source electrode pattern portion, wherein the mask is oriented such that the first direction is substantially perpendicular to a scan direction of a light exposure apparatus, wherein a first width between an edge of the drain electrode pattern portion and the first electrode portion is less than at least one of a second width between an edge of the drain electrode pattern portion and an edge of the second electrode portion and a third width between an edge of the drain electrode pattern portion and an edge of the third electrode portion.

13. The mask of claim 12, wherein each of the first width and the second width ranges from about 1.5 μm to about 3.5 μm.

14. The mask of claim 12, wherein a difference between the first width and the second width ranges from about 0.05 μm to about 0.45 μm.

15. The mask of claim 12, wherein the light exposure apparatus generates light having a wavelength of from about 380 nm to about 420 nm.

16. The mask of claim 12, wherein the second direction is substantially perpendicular to a scan direction of a light exposure apparatus.

17. The mask of claim 16, wherein a first width between an edge of the drain electrode pattern portion and an edge of the first electrode portion is greater than a second width between an edge of the drain electrode pattern portion and an edge of the second electrode portion, or between an edge of the drain electrode pattern portion and an edge of the third electrode portion.

18. A method of manufacturing a mask comprising:
forming a light-blocking material layer on a transparent substrate;
patterning the light-blocking material layer to form a light-blocking layer comprising:
a source electrode pattern portion comprising a first electrode portion extending in a first direction, a second electrode portion bent from a first end of the first electrode portion and extending in a second direction substantially perpendicular to the first direction and a third electrode portion bent from a second end of the first electrode portion and extending in the second direction; and
a drain electrode pattern portion disposed between the second electrode portion and the third electrode portion and extending in the second direction, the drain electrode pattern portion and the source electrode pattern portion disposed in non-overlapping positions so as to form a spaced-apart portion between the drain pattern portion and the source electrode pattern portion;

forming a halftone material layer on the transparent substrate having the light-blocking layer; and
patterning the halftone material layer to form a halftone layer comprising:
a halftone portion corresponding to a spaced-apart portion between the source electrode pattern portion and the drain electrode pattern portion; and
a dummy halftone portion connected to the halftone portion and more protrusive than an end of the source electrode pattern portion corresponding to the second direction.

19. The method of claim 18, wherein the first direction is substantially perpendicular to a scan direction of a light exposure apparatus.

20. The method of claim 19, wherein a first width between an edge of the drain electrode pattern portion and the first electrode portion is less than a second width between an edge of the drain electrode pattern portion and an edge of the second electrode portion, or between an edge of the drain electrode pattern portion and an edge of the third electrode portion.

21. The method of claim 18, further comprising forming a data line pattern portion connected to the source electrode pattern portion, wherein the data line pattern portion is simultaneously formed with forming the source electrode pattern portion and the drain electrode pattern portion.

22. A method of manufacturing a mask comprising:
forming a halftone layer and a light-blocking layer on a transparent substrate;
patterning the halftone layer and the light-blocking layer to form an electrode pattern portion; and
forming through the light blocking layer a first opening pattern extending in a first direction, a second opening pattern bent from the first opening pattern and extending in a second direction substantially perpendicular to the first direction, a third opening pattern bent from the second opening pattern and extending in the first direction, a fourth opening pattern bent from the third opening pattern and extending in a third direction opposite to the second direction, and a fifth opening pattern bent from the fourth opening pattern and extending in the first direction whereby a source electrode pattern portion and a drain electrode pattern portion spaced apart from the source electrode pattern portion are defined, wherein the source electrode pattern portion and the drain electrode pattern portion are positioned in a non-overlapping manner.

23. The method of claim 22, wherein a light exposure apparatus is used and the first direction is substantially perpendicular to a scan direction of the light exposure apparatus.

24. The method of claim 23, wherein the third opening pattern is formed to have a width narrower than a width of the second opening pattern and a width of the fourth opening pattern.

25. The method of claim 22, wherein forming the electrode pattern portion further comprises forming a data line pattern portion connected to the electrode pattern portion.

* * * * *